United States Patent
Rozak et al.

(10) Patent No.: US 10,643,827 B2
(45) Date of Patent: May 5, 2020

(54) MULTI-BLOCK SPUTTERING TARGET WITH INTERFACE PORTIONS AND ASSOCIATED METHODS AND ARTICLES

(71) Applicant: H.C. Starck, Inc., Newton, MA (US)

(72) Inventors: Gary Alan Rozak, Akron, OH (US); Mark E. Gaydos, Nashua, NH (US); Christopher Michaluk, Tucson, AZ (US)

(73) Assignee: H.C. STARCK INC., Newton, MA (US)

( * ) Notice: Subject to any disclaimer, the term of this patent is extended or adjusted under 35 U.S.C. 154(b) by 889 days.

(21) Appl. No.: 15/067,652

(22) Filed: Mar. 11, 2016

(65) Prior Publication Data

US 2016/0196962 A1    Jul. 7, 2016

Related U.S. Application Data

(62) Division of application No. 13/793,043, filed on Mar. 11, 2013, now Pat. No. 9,334,565.

(Continued)

(51) Int. Cl.
*H01J 37/34*    (2006.01)
*C23C 24/04*    (2006.01)
(Continued)

(52) U.S. Cl.
CPC ........ *H01J 37/3429* (2013.01); *B22F 1/0003* (2013.01); *B22F 3/15* (2013.01);
(Continued)

(58) Field of Classification Search
CPC ..... C23C 14/3407; C22C 1/045; C22C 24/04; H01J 37/3429
See application file for complete search history.

(56) References Cited

U.S. PATENT DOCUMENTS 2,678,268 A    5/1954   Ham et al.
2,678,269 A    5/1954   Ham et al.
(Continued)

FOREIGN PATENT DOCUMENTS

CN    1370853 A1    9/2002
CN    1660526 A    8/2005
(Continued)

OTHER PUBLICATIONS

Korean Office Action, Application No. 10-2016-70033898 dated May 2, 2016.

(Continued)

*Primary Examiner* — John J Brayton
(74) *Attorney, Agent, or Firm* — Morgan, Lewis & Bockius LLP

(57) ABSTRACT

A sputtering target that includes at least two consolidated blocks, each block including an alloy including a first metal (e.g., a refractory metal such as molybdenum in an amount greater than about 30 percent by weight) and at least one additional alloying ingredient; and a joint between the at least two consolidated blocks, the joint being prepared free of any microstructure derived from a diffusion bond of an added loose powder. A process for making the target includes hot isostatically pressing (e.g., below a temperature of 1080° C.), consolidated preform blocks that, prior to pressing, have interposed between the consolidated powder metal blocks at least one continuous solid interface portion. The at least one continuous solid interface portion may include a cold spray body, which may be a mass of cold spray deposited powders on a surface a block, a sintered preform, a compacted powder body (e.g., a tile), or any combination thereof.

21 Claims, 2 Drawing Sheets

Related U.S. Application Data

(60) Provisional application No. 61/644,669, filed on May 9, 2012.

(51) Int. Cl.
*C23C 14/34* (2006.01)
*C22C 1/04* (2006.01)
*C22C 27/04* (2006.01)
*B22F 3/15* (2006.01)
*B22F 7/06* (2006.01)
*B22F 1/00* (2006.01)
*B22F 3/24* (2006.01)

(52) U.S. Cl.
CPC .............. *B22F 3/24* (2013.01); *B22F 7/064* (2013.01); *C22C 1/045* (2013.01); *C22C 27/04* (2013.01); *C23C 14/3407* (2013.01); *C23C 14/3414* (2013.01); *C23C 24/04* (2013.01); *B22F 2003/153* (2013.01); *B22F 2003/247* (2013.01); *B22F 2301/20* (2013.01); *B22F 2998/10* (2013.01)

(56) References Cited

U.S. PATENT DOCUMENTS

| | | |
|---|---|---|
| 2,678,270 A | 5/1954 | Ham et al. |
| 3,714,702 A | 2/1973 | Hammond |
| 3,841,846 A | 10/1974 | Larsen et al. |
| 4,101,319 A | 7/1978 | Beyer et al. |
| 4,208,257 A | 6/1980 | Hom-ma et al. |
| 4,594,219 A | 6/1986 | Hostatter et al. |
| 4,647,426 A | 3/1987 | Fiorentino |
| 4,747,907 A | 5/1988 | Acocella et al. |
| 4,820,393 A | 4/1989 | Brat et al. |
| 4,931,253 A | 6/1990 | Eylon et al. |
| 4,938,798 A | 7/1990 | Chiba et al. |
| 4,949,836 A | 8/1990 | Schostek |
| 4,995,942 A | 2/1991 | David |
| 5,234,487 A | 8/1993 | Wichersham, Jr. et al. |
| 5,397,050 A | 3/1995 | Mueller |
| 5,429,877 A | 7/1995 | Eylon |
| 5,435,965 A | 7/1995 | Mashima et al. |
| 5,518,131 A | 5/1996 | Chen et al. |
| 5,595,616 A | 1/1997 | Berczik |
| 5,733,427 A | 3/1998 | Satou et al. |
| 5,857,611 A | 1/1999 | Gilman et al. |
| 5,895,663 A | 4/1999 | Irwin et al. |
| 5,896,553 A | 4/1999 | Lo |
| 5,963,778 A | 10/1999 | Stellrecht |
| 6,010,583 A | 1/2000 | Annavarapu et al. |
| 6,042,777 A | 3/2000 | Lo et al. |
| 6,071,389 A | 6/2000 | Zhang |
| 6,159,625 A | 12/2000 | Ueno |
| 6,165,413 A | 12/2000 | Lo et al. |
| 6,183,686 B1 | 2/2001 | Bardus et al. |
| 6,193,856 B1 | 2/2001 | Kida et al. |
| 6,199,747 B1 | 3/2001 | Cohn et al. |
| 6,328,927 B1 | 12/2001 | Lo et al. |
| 6,419,806 B1 | 7/2002 | Holcomb et al. |
| 6,433,842 B1 | 8/2002 | Kaneko et al. |
| 6,521,108 B1 | 2/2003 | Zhang |
| 6,619,537 B1 | 9/2003 | Zhang et al. |
| 6,638,381 B2 | 10/2003 | Keener et al. |
| 6,726,787 B2 | 4/2004 | Chern Lin et al. |
| 6,755,948 B1 | 6/2004 | Fukuyo et al. |
| 7,163,715 B1* | 1/2007 | Kramer .................. A61L 27/306 427/189 |
| 7,332,141 B2 | 2/2008 | Scharifker et al. |
| 7,336,324 B2 | 2/2008 | Kim et al. |
| 7,336,336 B2 | 2/2008 | Yoo et al. |
| 7,336,824 B2 | 2/2008 | Kato |
| 7,837,929 B2 | 11/2010 | Gaydos et al. |
| 2003/0052000 A1 | 3/2003 | Segal et al. |
| 2004/0108028 A1 | 1/2004 | Yi et al. |
| 2004/0009087 A1 | 6/2004 | Guo et al. |
| 2004/0159374 A1 | 8/2004 | Lin et al. |
| 2004/0263055 A1 | 12/2004 | Chao et al. |
| 2005/0122443 A1 | 6/2005 | Kim et al. |
| 2005/0189401 A1 | 9/2005 | Butzer |
| 2005/0191202 A1 | 9/2005 | Iwasaki et al. |
| 2005/0230244 A1 | 10/2005 | Inoue et al. |
| 2005/0279630 A1 | 12/2005 | Fonte |
| 2006/0042728 A1 | 3/2006 | Lemon et al. |
| 2007/0089984 A1* | 4/2007 | Gaydos .................. B22F 3/15 204/298.12 |
| 2007/0122649 A1 | 5/2007 | Lee et al. |
| 2007/0251820 A1 | 11/2007 | Nitta et al. |
| 2007/0289864 A1 | 12/2007 | Zhifei et al. |
| 2008/0073674 A1 | 3/2008 | Cho et al. |
| 2008/0118031 A1 | 5/2008 | Haywiser et al. |
| 2008/0216602 A1* | 9/2008 | Zimmermann ........... B22F 7/08 75/245 |
| 2008/0271779 A1 | 11/2008 | Miller et al. |
| 2008/0314737 A1 | 12/2008 | Gaydos et al. |
| 2009/0038362 A1 | 2/2009 | Jepson et al. |
| 2009/0301645 A1* | 12/2009 | Calla ....................... B32B 37/00 156/182 |
| 2010/0031720 A1 | 2/2010 | Bozkaya et al. |
| 2010/0086800 A1 | 4/2010 | Miller et al. |
| 2010/0108501 A1 | 5/2010 | Inaguma et al. |
| 2011/0097236 A1 | 4/2011 | Gaydos et al. |
| 2011/0117375 A1* | 5/2011 | Rozak ..................... C22C 1/045 428/457 |
| 2011/0303535 A1 | 12/2011 | Miller et al. |
| 2012/0003486 A1 | 1/2012 | Rozak et al. |

FOREIGN PATENT DOCUMENTS

| | | | |
|---|---|---|---|
| CN | 1676661 A | 10/2005 | |
| CN | 101063194 A | 10/2007 | |
| CN | 101360576 A | 2/2009 | |
| EP | 285130 A1 | 10/1988 | |
| EP | 590904 A1 | 4/1994 | |
| EP | 902102 A1 | 3/1999 | |
| EP | 1612292 A1 | 4/2006 | |
| JP | 63241164 A * | 10/1988 | ............ C22C 27/02 |
| JP | 4-333565 A | 11/1992 | |
| JP | 06-177085 | 6/1994 | |
| JP | 6-264233 | 9/1994 | |
| JP | 11-074218 | 3/1999 | |
| JP | 11-246967 | 9/1999 | |
| JP | 2000/239838 A | 9/2000 | |
| JP | 2000/284326 | 10/2000 | |
| JP | 2002/327264 A | 11/2002 | |
| JP | 2003-129232 A | 5/2003 | |
| JP | 2003/226966 A | 8/2003 | |
| JP | 2003-342720 A | 12/2003 | |
| JP | 2004-204253 A | 7/2004 | |
| JP | 2004217990 | 8/2004 | |
| JP | 2005-029862 A | 2/2005 | |
| JP | 2005-097697 | 4/2005 | |
| JP | 2005-307226 | 4/2005 | |
| JP | 2005/191361 A | 7/2005 | |
| JP | 2005/290409 | 10/2005 | |
| JP | 2006-114307 | 4/2006 | |
| JP | 2008/506852 A | 3/2008 | |
| JP | 2008-540823 | 11/2008 | |
| JP | 2005-528799 A | 8/2013 | |
| KR | 10-2007-0106402 A | 11/2007 | |
| WO | 1992/18857 A1 | 10/1992 | |
| WO | 97/029400 A1 | 8/1997 | |
| WO | 2004/090194 | 10/2004 | |
| WO | 2005/084242 A2 | 9/2005 | |
| WO | 2005/108639 A1 | 11/2005 | |
| WO | 2009/020587 A1 | 2/2009 | |
| WO | 2009/020619 A1 | 2/2009 | |
| WO | 2009/078283 A1 | 6/2009 | |
| WO | 2009/134771 A1 | 11/2009 | |
| WO | 2013049274 | 4/2013 | |
| WO | 2012/154817 A1 | 11/2013 | |

(56) References Cited

OTHER PUBLICATIONS

Final Korean Office Action, Application No. 10-2016-70033898 dated Aug. 16, 2016.
Second Chinese Office Action, Application No. 201380024344, dated Jul. 25, 2016.
Office Action from the Chinese Intellectual Property Office for copending patent application No. CN 201380024344, dated Dec. 3, 2015 with Translation of first two pages.
Office Action from the US Patent Office for copending U.S. Appl. No. 13/467,323, dated Nov. 5, 2015.
PCT/US2013/030316 International Search Report and Written Opinion, dated Oct. 4, 2013.
PCT Written Opinion of the International Preliminary Examining Authority dated Aug. 5, 2014; Appln. No. PCT/US2013/030316.
Office Action from the Korean Intellectual Property Office for copending patent application No. 10-2014-7034399, dated Mar. 3, 2015.
Office Action from the Korean Intellectual Property Office for copending patent application No. 10-2013-702787, dated Mar. 4, 2015.
Japanese Office Action dated Jun. 8, 2015; Application No. 2015-511446.
Office Action from the Korean Intellectual Property Office for copending patent application No. 10-2014-7034399, dated Jul. 1, 2015.
Matthew J. Donachie, Jr., "Titanium: A Technical Guide", ASM International, Dec. 2000, pp. 13-15.
H.C. Starck "Pure Molybdenum MMP Powder (99.95%)", Apr. 24, 2008.
M. Gerald, Atlantic Equipment Engineers, "Certificate of Analysis: Titanium Metal Powder Ti-106".
Primig,Sophie and Christian Mitterer, "Survey Report: Quantitative Analysis of MoTi Sputtering Targets", Feb. 7, 2012.
Contribute to the Development of Light Metal through Encouragement and Promotion of Reseach Study Education, Published in Surface and Coating Technology, vol. 169-170, pp. 151-154, (month unavailable) 2003, H. Habazaki et al., "Formation of Barrier-type Amorphous Anodic Films on Ti—Mo Alloys," pp. 1-3.
Procedings International Conference on Shape Memory and Superelastic Technologies (SMST—2003), M.H. Wu et al., Psuedoelastic Beta Ti—Mo—V—Nb—Al Alloys.
Interdiffusion Studies between a Mo-Based Alloy and Ti; Laik et al.; Metallurgical and Materials Transactions A, Springer-Verlag, New York, vol. 37, No. 10, pp. 2919-2926; dated Oct. 1, 2006.
International Search Report dated Aug. 5, 2010 from the European Patent Office for copending application PCT/US2010/040756 filed on Jul. 1, 2010.
International Search Report, PCT/US2010/040772, dated Aug. 5, 2010.
International Search Report, PCT/US2012/037071 filed on May 9, 2012.
International Search Report Issued in International Patent Application No. PCT/US2006/040214, dated Jun. 29, 2007.
Copending U.S. Appl. No. 12/827,550, filed Jun. 30, 2010, entitled, 'Molybdenum Containing Targets,' Applicaint Rozak, et al. (Published as US2012/0003486 A1 on Jan. 5, 2012.
Copending U.S. Appl. No. 13/856,617, filed Apr. 4, 2013, entitled, 'Molybdenum Containing Targets Comprising Three Metal Elements,' Applicants Rozak, et al.
Copending U.S. Appl. No. 12/827,562, filed Jun. 30, 2010 entitled 'Molybdenum Containing Targets,' Applicants Rozak et al.
Copending U.S. Appl. No. 13/857,508, filed Apr. 5, 2013, entitled, Molybdenum Containing Targets, 'Applicant Rozak et al.
Copending U.S. Appl. No. 13/467,323, filed May 9, 2012, entitled, "Multi-Block Sputtering Target and Associated Methods and Articles," Applicant Rozak, et al. (published as US2012/0285826A1 on Nov. 15, 2012).
Copending U.S. Appl. No. 13/793,043, filed Mar. 11, 2013, entitled. 'Multi-Blocksputtering Target with Interface Portions and Associated Methods and Articles.' Applicant Rozak, et al.
Copending U.S. Appl. No. 12/090,919, filed Jul. 11, 2008, entitled, "Methods of Making Molybdenum", Applicant Gaydos, et al. (Publication: US2008/0314737 A1 on Dec. 25, 2008).
Copending U.S. Appl. No. 12/917,668, filed Nov. 2, 2010, entitled, "Methods of Making Molybdenum", Applicant Gaydos, et al. (Publication: US2011/0097236 on Apr. 28, 2011).
Non-Final Office Action from the US Patent Office for U.S. Appl. No. 12/827,550 dated Aug. 3, 2012.
Final Office Action from the US Patent Office for U.S. Appl. No. 12/827,550 dated Jan. 25, 2013.
Non-Final Office Action from the US Patent Office for U.S. Appl. No. 12/827,562 dated Aug. 10, 2012.
Final Office Action from the US Patent Office for U.S. Appl. No. 12/827,562 dated Jan. 10, 2013.
Non-Final Office Action from the US Patent Office for U.S. Appl. No. 11/255,018 dated May 1, 2007.
Final Office Action from the US Patent Office for U.S. Appl. No. 11/255,018 dated Sep. 27, 2007.
Non-Final Office Action from the US Patent Office for U.S. Appl. No. 11/255,018 dated Apr. 24, 2008.
Final Office Action from the US Patent Office for U.S. Appl. No. 11/255,018 dated Nov. 24, 2008.
Non-Final Office Action from the US Patent Office for U.S. Appl. No. 11/255,018 dated Aug. 25, 2009.
Final Office Action from the US Patent Office for U.S. Appl. No. 11/255,018 dated May 6, 2010.
Non-Final Office Action from the US Patent Office for U.S. Appl. No. 12/090,919 dated Jun. 22, 2011.
Final Office Action from the US Patent Office for U.S. Appl. No. 12/090,919 dated Dec. 6, 2011.
Chinese Office Action for 1369.023CN dated Jan. 22, 2010 (in Chinese).
Chinese Office Action for 1369.023CN dated Jan. 22, 2010 tranlated by Chinese Agent, Shanghai Patent & Trademark Law Office, LLC dated Feb. 25, 2010.
European Search Report dated Feb. 25, 2011, for European Patent Application No. 10194969.1-2122.
Opposition filed with the European Patent Office by Heraeus Materials Technology GmbH & Co. KG—filed Feb. 7, 2012 for European Patent Application No. 10194969.1-2122.
Opposition filed with the European Patent Office by Plansee SE—filed Feb. 10, 2012 for European Patent Application No. 10194969.1-2122.
Office Action from the Japan Patent Office for Application 2008-536705 dated Jun. 7, 2012. (with translation of reasons for refusal).
Office Action from the Taiwan Patent Office for Application No. 95138492 dated Mar. 1, 2013. (with translation).
Office Action from the Taiwan Patent Office for Application No. 95138492 dated Sep. 28, 2012. (with translation).
Office Action for Korean Patent Application No. 10-2008-7012051 dated Apr. 8, 2013. Translation received Apr. 19, 2013.
International Preliminary report on patentability dated Jan. 17, 2013: Application No. PCT/US2010/040772.
International Preliminary report on patentability dated Jan. 17, 2013: Application No. PCT/2010/040756.
Korean Office Action, Application No. 10-2016-70033898 dated Dec. 1, 2016.

* cited by examiner

MULTI-BLOCK SPUTTERING TARGET WITH INTERFACE PORTIONS AND ASSOCIATED METHODS AND ARTICLES

CLAIM OF BENEFIT OF FILING DATE

The present application claims the benefit of the filing date of U.S. Application Ser. No. 61/644,669 filed May 9, 2012, the contents of which are expressly incorporated by reference.

FIELD OF THE INVENTION

The present invention relates generally to sputtering, and more particularly to improved multi-component sputtering targets and their manufacture and use to produce thin films that include a plurality of blocks joined together during a consolidation operation (such as a hot isostatically pressing operation), which avoids diffusion bonding of loose powder, to define at least one interface portion.

BACKGROUND OF THE INVENTION

Sputtering processes are employed to deposit thin films onto substrates to manufacture any of a variety of devices. Sputtering processes typically involve bombarding a solid sputtering target with energized particles to eject atoms from the target. In recent years, there has been a growing need for large area sputtering targets. This is especially so for certain applications in which large sized products are made. For example, flat panel displays often require the deposition of uniform thin films onto a substrate. The demand for larger displays, such as for televisions, continues to strain materials producers to develop alternative approaches to the efficient supply of such materials.

In one specific application, according to U.S. Pat. No. 7,336,324 (Kim el at), the deposition of a molybdenum-titanium barrier layer onto a substrate has been employed for the manufacture of a liquid crystal display device. Such application intensifies the need for large display devices capable of delivering such materials, particularly targets that contain both molybdenum and titanium.

In the manufacture of large area sputtering targets it is often deemed critical and imperative that the target exhibit uniformity in composition, microstructure, or a combination of both. For some device manufacturers that rely upon the targets to manufacture devices, the slightest imperfections are perceived as a potential quality control risk. By way of example, one concern for manufacturers is the potential formation of particles (e.g., atomic clusters or aggregates having an atomic composition different than the atomic composition of other regions of the film) during device manufacture. U.S. Pat. No. 6,755,948 (Fukuyo et al) discusses the potential effects of particles in the context of titanium targets.

Activities in the sputtering target field are illustrated by reference to a number of patent filings. By way of illustration, U.S. Patent Application No. 20070089984 describes the formation of a large area sputtering target by the use of a powder between cold-isostatically pressed blocks of a mixture of molybdenum and titanium powders. The use of such powder generally results in the formation of a conspicuous bond line between adjoining blocks. Even if such bond line does not actually adversely affect performance, its conspicuous nature is a potential concern for device manufacturers. For instance, some manufacturers have the perception that the bond line may contribute to the formation of undesired particles during sputtering; if generated, there is a belief that such particles potentially might affect performance of resulting devices. U.S. Pat. No. 4,594,219 (Hostatter et al) addresses side-by-side consolidation of preforms to form complex or compound shaped articles (e.g., connecting rods and hand wrenches). Consolidation (e.g., by hot isostatic pressing) of molybdenum and/or titanium powder containing preforms is not described. Moreover, particular processing steps to achieve successful results in the consolidation of molybdenum and/or titanium powder containing preforms is also not described.

U.S. Patent Application No. 20050191202 (Iwasaki et al) discloses a molybdenum sputtering target (in which an example is provided of a 70.0 at % Mo-30.0 at/ % Ti material). The application discloses a requirement for use of relatively high temperatures and pressures, stating at paragraph 40 that if a pressure below 100 MPa and a temperature below 1000° C. is used, "it is hard to produce the sintered body having a relative density of not less than 98%". The application describes a process by which a relatively large size body is consolidated from secondary powders and then the sintered body is cut into separate targets. One example illustrates a further hot plastic working step.

U.S. Patent Application Publication 20050189401 (Butzer) discloses a method of making a large Mo billet or bar for a sputtering target wherein two or more bodies comprising Mo are placed adjacent one another (e.g. stacked one on the other) with Mo powder metal present at gaps or joints between the adjacent bodies. The adjacent bodies are hot isostatically pressed to form a diffusion bond at each of the metal-to-Mo powder layer-to-metal joint between adjacent bodies to form a billet or bar that can be machined or otherwise formed to provide a large sputtering target. This patent publication appears to disclose bonding of major side surfaces, not edge-to-edge bonding of plates.

U.S. Patent Application No 20080216602 (Zimmerman et al) describes another method for making large area sputtering targets with a molybdenum-titanium composition, which includes a cold spray deposition step for joining a plurality of targets at an interface. Though acknowledging certain electron beam welding and hot isostatic pressing processes to join targets, in paragraphs 165-166 (referring to FIGS. 17 and 18), the patent application indicates that electron beam welding results in porosity, and the hot isostatic pressing results in a brittle alloy phase.

U.S. Patent Application No 20070251820 (Nitta et al) describes an example of another approach to the manufacture of a molybdenum-titanium sputtering target. In this publication, diffusion joining (at a temperature of at least 1000° C.) of two or more previously sintered or melted sputter targets along at least one side is addressed. The use of a Mo—Ti powder in the joint is described.

U.S. Patent Application No. 20070289864 (Zhifei et al) identifies a need in large area sputtering targets to fill gaps between multiple target sections carried on a common backing plate. The patent illustrates the material deposition processes between adjoining target portions. Interestingly, the patent recognizes that the manufacture of large molybdenum plate targets poses difficulties, and the need for efficient manufacturing.

Cold spray technology is an approach that has been employed to deposit a powder material onto a substrate in the absence of heating the powder materials. The use of cold spray processes in the field of sputtering targets is illustrated in United States Patent Application Nos. 20080216602; 20100086800; 20110303535; and U.S. Pat. No. 7,910,051, all incorporated by reference herein for all purposes.

The formation of multi-component large scale sputtering targets that include molybdenum and at least one additional alloying element is taught in commonly owned U.S. Provisional Application Ser. No. 61/484,450 filed on May 10, 2011, and Ser. No. 13/467,323 filed on May 9, 2012, and also PCT Publication No. WO 2012/154817, each incorporated by reference herein for all purposes.

In view of the above, there remains a need in the art for alternative sputtering targets (especially large size targets, such as targets exceeding about 0.5 meters, about 1 meter, or even about 2 meters for its largest dimension), and approaches to their manufacture that meet one or any combination of the needs for general uniformity of composition, general uniformity of microstructure, insubstantial likelihood of particle formation, or relatively high strength (e.g., relatively high transverse rupture strength). Moreover, there remains a need in the art for alternative sputtering targets that avoid the need for powder during any final hot isostatic pressing process. For instance, it may be desirable that any added material that will become part of a joint between adjoining blocks is a generally solid and cohesive mass of material prior to a final consolidation (e.g., by a hot isostatic pressing operation). The ability to minimize any visible joint lines or other visible variations m continuity of structure, though not critical for present purposes, may also be a desirable attribute.

SUMMARY OF THE INVENTION

In one aspect, the present teachings meet one or more of the above needs by providing a sputtering target, which may in particular be a relatively large sputtering target (e.g., exceeding about 0.5 meters, about 1 meter, or even about 2 meters for its largest dimension; or stated in another way, exceeding about 0.3 square meters ($m^2$), 0.5 $m^2$, 1 $m^2$, or even 2 $m^2$ for the target sputtering surface available for sputtering), comprising at least two consolidated blocks, each block including an alloy including a first metal (e.g., a refractory metal such as molybdenum, which may be present in an amount greater than about 30 percent by weight) and at least one additional alloying element; at least one continuous solid interface portion; and a joint between the at least two consolidated blocks, which joins the blocks together to define a target body. The joint may include at least one continuous solid interface portion (which desirably may be a generally coherent metallic mass, such as one that is formed in situ from a particulated starting material (e.g., such as by cold spray deposition of a metallic powder mixture), one that is formed in a separate densification operation (e.g., compacting, sintering or both), or both). Desirably, the sputtering target along the joint will also exhibit a transverse rupture strength per ASTM B528-10, of at least about 400 MPa.

In another aspect, the teachings herein meet one or more of the above needs by providing a method for making a sputtering target, comprising the steps of providing first and second at least partially consolidated powder metal blocks each optionally having a prepared surface, and each including an alloy including a first metal (e.g., a refractory metal such as molybdenum, which may be present in an amount greater than about 30 percent by weight), and at least one additional alloying element, interposing between the consolidated powder metal blocks at least one continuous solid interface portion (e.g., before a final consolidating step); contacting the prepared surface of the first block indirectly with the prepared surface of the second block via the at least one continuous solid interface portion in the substantial absence of any bonding agent between the contacted surfaces to form a contacted joint structure; isostatically pressing the contacted structure at a temperature (e.g., one that is less than about 1080° C.), at a pressure and for a time sufficient to realize a consolidated joint between the first and second blocks.

The continuous solid interface portion may be formed in the absence of applying powder between blocks prior to a joining step; namely the steps of manufacture would avoid any loose powder between blocks to accomplish diffusion bonding during a hot isostatic pressing step that results in the formation of a target body, such as a large scale target body, which includes the blocks. The continuous solid interface portion may be formed by employing a step selected from (a) cold spraying a metal powder onto at least one of the blocks for forming the at least one continuous solid interface portion (e.g., along a side edge of one or more blocks); (b) compacting a body of metal powder (e.g., a metal powder admixture) to form the at least one continuous solid interface portion (which is thereafter interposed between blocks); (c) sintering a body of a metal powder mixture to form the at least one continuous solid interface portion (which is thereafter interposed between blocks); (d) cold spraying a metal powder into a die for forming the at least one continuous solid interface portion; (e) cold spraying a metal powder onto a substrate to form the at least one continuous solid interface portion that may optionally include, but preferably omits, the substrate; or (f) any combination of (a) through (e). The continuous solid interface portion thus may be the result of employing a cohesive mass that is formed in situ with metal powder blocks (e.g., by a cold spraying operation) or is formed as a preform (e.g., a tile that is compacted, sintered, and/or cold sprayed, and is thereafter interposed between blocks). Though the cohesive mass is contemplated to have some porosity, desirably the average size of any pores is sufficiently small and the pores are substantially uniformly distributed so that voids would not result in irregular shrinkage in a consolidated joint following a final consolidating step to make a large area target.

In general, when a mixture of molybdenum and titanium is employed to make the continuous solid interface portion, conditions may be employed so that prior to any final consolidating step, the amount of uncombined titanium remains generally high. For example, the amount of starting titanium powder in the mixture that remains unalloyed prior to a final consolidating step to form a resulting target is at least 50%, 60%, 70%, 80%, 90% or more by weight of the total titanium in the mixture. Thus, the step of forming any continuous solid interface portion precursor (e.g., a cold sprayed mass, a tile, a sintered body or any combination thereof) may be done at a temperature below the melting point of titanium. If steps are performed above the melting point of titanium in the mixture, then they are performed for a time sufficient for avoiding alloy formation with other metals in the mixture by which less than about 50%, 40%, 30%, 20%, or even 10% by weight of the starting titanium in the powder mixture becomes alloyed with another metal in the powder mixture.

The target bodies in accordance with the teachings herein may have a Vickers Hardness (HVN) per ASTM E384-06 of at least about 260, about 275 or even about 300; for example, it may have an HVN of about 260 to about 325. The target, the target body, the alloy, one or more consolidated blocks, or any combination thereof may include molybdenum in an amount greater than about 30 weight percent. The target, the target body, the alloy, one or more consolidated blocks, or any combination thereof may include molybdenum in an amount greater than about 30 atomic percent. The target, the target body, the alloy, the consolidated blocks, or any combination thereof preferably may include molybdenum in an amount greater than about 30 volume percent. The target body may have a density of at least about 0.92, 0.95 or even 0.98 times the theoretical density of the overall material per ASTM B311-08. For one illustrative target that consists essentially of molybdenum and titanium, the target body may have a density in the range of about 7.12 to about 7.30, and more specifically about 7.20 to about 7.25 g/cm$^3$. The sputtering target body may also be sufficiently strong so that it withstands, without fracture, routine stresses encountered during subsequent assembly operations (e.g., a three point straightening assembly operation, a creep flattening operation, or some other operation during which the target body and any joint may be subjected to a load of greater than about 0.6 MPa).

In yet another aspect of the teachings herein, it is contemplated that sputtering is performed using a sputtering target in accordance with the present teachings. It also is contemplated that thin films result that are used in any of a number of electronic devices (e.g., as a barrier layer, an electrode layer or both), such as one or more of a television, a video display, a smartphone, a tablet computer, a personal digital assistant, a navigation device, a sensor a portable entertainment device (e.g., video players, music players, etc.), or even a photovoltaic device. The thin films may have a reduced amount of structural artifacts attributable to particles as compared with sputtering using targets made with powder joints.

DETAILED DESCRIPTION

Figure 1:
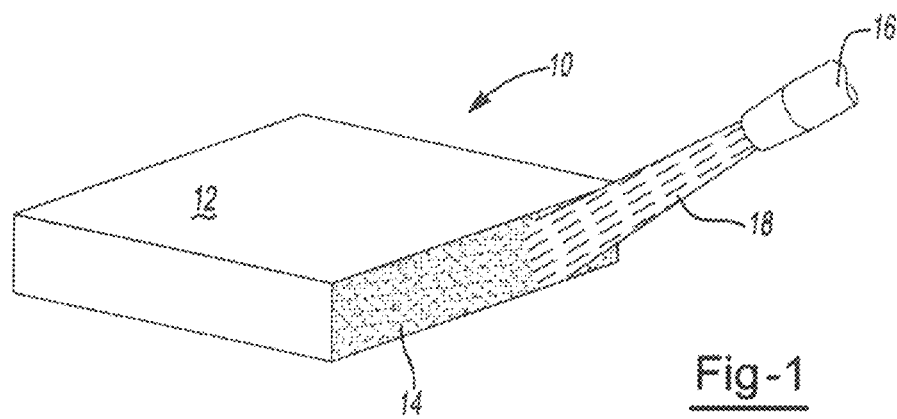
FIG. 1 is an illustration of a cold spray joint preparation.

Turning now in more detail to particular teachings of the present invention, in general, the present teachings envision a relatively large sputtering target, and particularly a sputtering target consolidated from metal powder, wherein the target is made by joining multiple blocks in the absence of a powder interface. The target generally will include a target body (namely, the consolidated portion of the target, and specifically the portion of the overall target assembly that is subjected to bombardment for purposes of material removal and sputter deposition) that may be joined to a backing plate in any suitable art disclosed manner. The sputtering target body may be any suitable geometry. It may be generally circular (so that it would have a diameter as its largest dimension). It may be rectangular, and thus have one of its side edges as having its largest dimension (e.g., the length of the side edge). It may be tubular. Though the teachings herein also apply to smaller sputtering targets, they have particular utility for larger scale targets. By way of example, larger scale target bodies may be sized such that they exceed about 0.5 meters, about 1 meter, or even about 2 meters for its largest dimension. Examples of such target bodies may be generally rectangular targets having a length that exceeds about 0.5 meters, about 1 meter, or even about 2 meters. Such target bodies may have a width that exceeds about 0.5 meters, about 1 meter, or even about 2 meters. The resulting target bodies may exceed about 0.3 square meters (m$^2$), 0.5 m$^2$, 1 m$^2$, or even 2 m$^2$ for the target sputtering surface available for sputtering.

The target body is typically made to include at least two consolidated preformed blocks, and a consolidated joint portion, which preferably may be a continuous solid interface portion, therebetween. The consolidated blocks will typically be sized (e.g., length, width, area, or any combination thereof) to be smaller than the overall resulting target body. For example, they may be about one half (or smaller) the size (e.g., length, width, or area) of the desired resulting target body (e.g., they may be about 1/n the size of the desired resulting target body, wherein n refers to the total number of consolidated blocks employed to make the target body, exclusive of any intermediate tiles as described herein). Each of the consolidated blocks may each be approximately the same size as each other block. One or more consolidated block may be smaller than another other blocks. The blocks may be of generally the same shape as each other, or they may differ as to shape. The blocks may have a generally rectangular prism shape. The blocks may be generally cylindrical. The blocks may include one or more channels, through holes or other openings For example, the blocks may be generally cylindrical and have a through passage for defining a tubular shaped block. One or more side walls of the block may be generally orthogonally oriented relative to a surface that will function as a sputtering surface. One or more side walls of the block may be generally oriented at a slope angle of at least ±5°, 10°, 20° or more relative to a plane that would be perpendicular to a sputtering surface. In this manner it is possible that a joint may employ a scarf joint between adjoining blocks. Other joint structures other than a butt joint or a scarf joint may be employed, such as a lap joint, dovetail joint, or any combination of the above joints.

More particularly, a plurality of blocks are prepared by consolidating powdered metal. The consolidation may occur from sintering, cold isostatic pressing, hot isostatic pressing, otherwise compacting (e.g., rolling, die compacting or both) or any combination thereof. For example, one approach is to first compact to about 60 to about 85% of theoretical density, such as by cold isostatically pressing a mass of powders of the desired composition (such as is taught in U.S. Patent Application No. 20070089984 at paragraph 50 through 53, incorporated herein by reference (Gaydos et al)). The resulting compacted forms may be machined to form block precursor structures. The blocks (or block precursor structures) may be further densified such as by hot isostatically pressing to form blocks that will be joined with others to form a target body. It is contemplated that the powdered metal, before consolidation, will include one or more powders of a substantially pure metal (e.g., having a purity (defined to mean free of metallic elements) of at least about 99.5%, 99.95% or even 99.995% purity).

The powders, before consolidation, will typically have an average particle size of less than about 50 μm, or even less than about 35 μm, as measured according to ASTM B822-10. For example molybdenum powders, before consolidation will typically have an average particle size of less than about 25 μm, or even less than about 5 μm, as measured according to ASTM B822-10. When titanium is employed, the titanium powders may have an average particle size of less than about 50 μm, or even less than about 35 μm. The titanium powders may have an average particle size of higher than about 5 μm, or even higher than about 25 μm.

Prior to consolidation, powders may be blended in accordance with art disclosed powder blending techniques. For example, mixing may occur by placing the molybdenum and titanium powders in a dry container and rotating the container about its central axis. Mixing is continued for a period of time sufficient to result in a completely blended and uniformly distributed powder. A ball mill or similar apparatus (e.g., rotating cylindrical, rotating cone, double cone, twin shell, double planetary, and/or sigma-blade blender) may also be used to accomplish the blending step. As discussed herein, and unless otherwise stated, references to metal powders include powders of one metal or a combination of two or more metals.

The composition in each block of the resulting target body will generally include molybdenum and at least one additional alloying element. For example, the composition may include an alloy including molybdenum in an amount so that in the resulting target body there is a substantially pure phase of molybdenum present in an amount greater than about 30 vol %, greater than about 35 vol %, or even greater than about 40 vol % of the resulting target body, and at least one additional alloying ingredient. The composition may include an alloy including molybdenum in an amount so that in the resulting target body there is a substantially pure phase of molybdenum present in an amount less than about 48 percent by weight, or even less than about 45 percent by weight (e.g., about 43 percent by weight) of the overall block, and at least one additional alloying ingredient. The amount of the molybdenum in the target, the alloy, or both, may range from about 5 to about 95 at %. more preferably about 20 to about 80 at %, still more preferably about 30 to about 70 at %. It may be about 40 to about 60 at % (e.g., about 50 at %). The remaining alloying elements may make up the balance. For example, the amount of titanium in a system employing only molybdenum and the additional alloying element powder may be about 100 at % minus the amount (in at %) of molybdenum. Thus, as can be seen from the above, the teachings contemplate a composition of the target, the alloy, or both, of about 30 to about 70 at % Mo and the balance being the at least one additional alloying element such as titanium (e.g., about 50 at % Mo and about 50 at % of another element (such as titanium)).

In general, when a mixture of molybdenum and titanium is employed to make the continuous solid interface portion, conditions may be employed so that prior to any final consolidating step, the amount of uncombined titanium for use as a continuous solid interface to define the consolidated joint portion remains generally high. For example, the amount of starting titanium powder in the mixture that remains unalloyed prior to a final consolidating step to form a resulting target is at least 50%, 60%, 70%, 80%, 90% or more by weight of the total titanium in the mixture. Thus, the step of forming any continuous solid interface portion precursor (e.g., a cold sprayed mass, a tile, a sintered body or any combination thereof) may be done at a temperature below the melting point of titanium. If steps are performed above the melting point of titanium in the mixture, then they are performed for a time sufficient for avoiding alloy formation with other metals in the mixture by which less than about 50%, 40%, 30%, 20%, or even 10% by weight of the starting titanium in the powder mixture becomes alloyed with another metal in the powder mixture.

The at least one additional alloying element may be a metallic element, such as one selected from titanium, chromium, niobium, zirconium, tantalum, tungsten or any combination thereof. It is possible that the at least one additional alloying element may include hafnium and/or vanadium. It is also possible that the at least one additional alloying element may include one or more alkali metal (e.g., lithium, sodium and/or potassium in an amount of less than about 10 at % or even 5 at % of the total composition). Examples of suitable alloying ingredients are disclosed in PCT Application No. WO2009/134771, and U.S. application Ser. Nos. 12/990,084; 12/827,550 and 12/827,562 (all incorporated by reference). The amount of the at least one additional alloying ingredient may be such that it will result in (i) a substantially pure phase of that alloying element; and/or (ii) an alloy phase that includes molybdenum and the at least one alloying element. By way of example, the amount of the at least one additional alloying element may be sufficient to obtain a substantially pure phase of the at least one additional alloying element that is at least about 2, 4 or even about 6 vol % of the resulting target body. The amount of the at least one additional alloying element may be sufficient to obtain a substantially pure phase of the at least one additional alloying element that is less than about 25 vol %, 15 vol % or even about 10 vol % of the resulting target (e.g., the resulting target body).

The amount of each of the molybdenum and the at least one additional alloying element may be sufficient to realize in the resulting target body an alloy phase (i.e., one that includes both molybdenum and the at least one additional alloying element) in an amount greater than about 30 vol %, 40 vol %, 44 vol % or even about 48 vol %. For example, the alloy may be present as s major constituent of the block, by volume. The amount of each of the molybdenum and the at least one additional alloying element may be sufficient to realize in the resulting target body an alloy phase that includes both molybdenum and the at least one additional alloying element in an amount less than about 70 vol %, 60 vol %, 56 vol % or even about 52 vol %. As can be seen, the alloy phase may be present as a major constituent of the block, by volume.

The resulting target body may be further characterized by at least one, preferably a combination of at least two features, more preferably a combination of at least three features, still more preferably a combination of at least four features, and even still more preferably a combination of all features selected from the following features (i) through (v); (i) at least one joint between at least two consolidated blocks (e.g., side-by-side or end-to-end adjoining blocks) that is free of microstructure derived from diffusion bonding an added loose powder bonding agent; (ii) at least one joint between at least two consolidated blocks (e.g., side-by-side (such as face-to-face) or end-to-end adjoining blocks); (iii) a sputtering target body that is at least about 0.5 meters, about 1 meter, or even about 2 meters, along its largest dimension, and which exhibits a transverse rupture strength per ASTM B528-10 that is generally uniform (e.g., the fluctuation from low to high is less than about 50% the highest value, or even less than about 35% of the highest value) throughout the body, including across the joint, and/or which may be at least about 400 MPa, 500 MPa, 600 MPa, 700 MPa, 800 MPa or even 900 MPa; (iv) the target body exhibits a Vickers Hardness (HVN) of at least about 260, about 275 or even about 300 (e.g., it may have an HVN of about 260 to about 325); or (v) the target body may have a density of at least about 0.92, about 0.95 or even about 0.98 times the theoretical density of the overall material (e.g., for a target body that consists essentially of molybdenum and titanium, the target body may have a density in the range of about 7.12 to about 7.30, and more specifically about 7.20 to about 7.25 g/cm³). The sputtering target body may also be sufficiently strong so that it withstands, without fracture, routine stresses encountered during subsequent assembly operations (e.g., a three point straightening assembly operation, a creep flattening operation, or some other operation) during which the target body and any joint may be subjected to a load of greater than about 0.6 MPa. Methods herein thus may include one or more steps of performing an assembly operation (e.g., an assembly operation selected from a three point straightening operation, a creep flattening operation, or both). As discussed previously, another aspect of the present teachings, which is believed to result in sputter target bodies that exhibit one or more of the features discussed previously in this paragraph pertains to methods for making a sputtering target. Broadly stated, the methods include steps of consolidating at least two blocks into preforms, and joining the blocks together. The joining of the blocks is desirably done under heat and pressure, and in a manner that otherwise avoids the need for reliance upon an intermediate powder bonding agent between opposing surfaces of the blocks as a primary mode of assuring a bond between the blocks.

Desirably, the bonding of adjoining blocks relies mainly upon the formation of at least some metallic bonds (with some mechanical bonding being possible as well) between metal from opposing cold-sprayed surfaces of the blocks, opposing surfaces of a block and a preform tile (e.g., a previously sintered and/or a die-compacted tile, which itself may be formed by cold-spraying, may include a cold sprayed surface, or both), or any combination of the above.

Accordingly, one approach involves a step of making a plurality of consolidated blocks as preforms. The preforms may have substantially the same composition as each other. The preforms may be made in a substantially identical manner as each other. The preforms may be consolidated in any suitable manner. The blocks of the preforms may be any suitable geometry. For example, they may be generally rectangular prisms. They may be generally cylindrical. They may be hollow (e.g., tubular). Other shapes are also possible.

Typically the manufacture of the blocks will employ a powder starting material. The powder may be densified by the application for a desired period of time of heat, pressure or both. For example, they may be compacted, sintered, cold isostatically pressed, hot isostatically pressed or any combination thereof. An initial compaction step may occur. For example, an initial step may be employed to compact a mass of powder to about 50 to about 85% of theoretical density (e.g., about 60 to about 70% of theoretical density). This may be done by a suitable cold isostatic pressing operation. One or more secondary operations may also be performed, such as a cold working step, a hot working step or otherwise.

A preferred approach to consolidation includes a step of hot isostatically pressing (HIP) a mass (e.g., an uncompacted powder mass or a compacted powder mass) at a pressure of at least about 100 MPa. For example, with molybdenum-containing materials (as well as others), the HIP process desirably may be performed at a temperature below about 1080°C, (e.g., at about 1050°C.), 1000° C., 950° C., 900° C., or even below about 850° C. (e.g., at about 825° C.). The HIP process may range in duration from about 1 to about 12 hours, and more preferably about 4 or 6 to about 10 hours (e.g., about 8 hours). By way of example, without limitation, the mass may be pressed to generally rectangular blocks having a thickness of about 10 mm to about 60 mm, and more preferably about 15 mm to about 45 mm (e.g., about 15 mm, about 25 mm, about 35 mm or even about 45 mm). The mass may be pressed into a generally rectangular block having a width of about 25 to about 100 mm (e.g., about 30 mm, about 50 mm or even about 90 mm), and more preferably from about 30 mm to about 50 mm. The mass may be pressed into a generally rectangular block having a length of about 70 mm to about 160 mm, and more preferably about 90 mm to about 150 mm (e.g., about 90 mm, about 120 mm, or even about 150 mm).

Two, three, or more blocks are joined to form a target body. As mentioned, preferably this is done in without employing a loose powder bonding agent as the primary means of joining. For example, though some amounts of a bonding agent may be employed, aspects of the present teachings contemplate that the joining, to make the target body, may be achieved in the absence of any bonding agent (e.g., absence of any loose powder bonding agent). By way of illustration, two blocks may be prepared, each having dimensions of about 1.5 meters long by about 0.9 meters wide by about 0.16 meters thick. They may be joined together along opposing width edges (e.g., with a continuous solid interface portion therebetween) to form a target body. In another illustration, two blocks may be prepared, each having dimensions of about 1.2 meters long by about 0.5 meters wide by about 0.46 meters thick. They are joined together along opposing length edges to form a target body. In still another illustration, two blocks may be prepared, each having dimensions of about 1.2 meters long by about 0.5 meters wide by about 0.3 meters thick. They are joined together, with at least one continuous solid interface portion therebetween, along opposing length edges to form a target body. In still yet another illustration, three blocks may be prepared, each having dimensions of about 0.9 meters long by about 0.3 meters wide by about 0.25 meters thick. They are joined together along opposing length edges with at least one continuous solid interface portion therebetween, to form a target body. More than three blocks can be employed, such as an array of two or more blocks along two or more axes.

Following the pressing, but prior to the joining of the preform blocks to form a sputter target body, one or more surfaces of the preform blocks may be surface prepared (e.g., surface roughened and/or polished, whether chemically, mechanically, electrochemically, a combination thereof or otherwise) to impart a desired surface finish, such as for increasing surface area of the surface for contacting an adjoining block as compared with a surface that is not surface prepared, or for otherwise increasing contact area between two or more adjoining blocks. For example, surfaces that are to oppose each other when joined desirably are prepared (e.g., roughened). They may be prepared so as to achieve an arithmetic average surface roughness $R_A$ (as measured by ASTM B946-06) that may be at least about 50 µ-in (1.3 µm), or even at least about 100 µ-in (2.6 µm,)(e.g., about 120 µ-in (3 µm) to about 150 µ-in (3.8 µm)). They may be prepared so as to achieve an arithmetic average surface roughness $R_A$ (as measured by ASTM B946-06) that may be less than about 200 µ-in (5.1 µm), less than at least about 180 µ-in (4.6 µm) or even less than about 150 µ-in (3.8 µm), or even less than about 120 µ-in (3 µm). For example, the arithmetic average surface roughness $R_A$ (as measured by ASTM B946-06) may range from about 50 µ-in (1.3 µm) to about 150 µ-in (3.8 µm)), and more specifically about 63 µ-in (1.6 µm) to about 125 µ-in (about 3.2 µm).

One possible approach to achieving a desired surface finish is to cold-spray deposit powders onto at least one surface of a consolidated clock to the desired roughness. This may be done with or without a step of surface roughening prior to the cold spray deposition. It is contemplated that any step of cold spraying may include depositing a mixture of powders of at least two different unalloyed metals onto a side of at least one of the consolidated blocks to define the at least one continuous solid interface portion for causing the powders to mechanically attach to the block, while generally avoiding the presence of loose powders. Illustrative cold spray teachings can be found in United States Patent Application Nos. 20080216602; 20100086800; 20110303535: and U.S. Pat. No. 7,910,051, all incorporated by reference herein for all purposes. In general, a suitable device having a nozzle (e.g., a cold spray gun) ejects a powder mixture jet at supersonic speed to direct the powder mixture onto a surface. It will be appreciated that "cold spray" does not exclude other kinetic spray systems. The term cold spray is used throughout the teachings herein. However, it is understood that it is possible to use a kinetic spray process as well.

A gas jet flowing at supersonic speed is imparted upon a mass of powder, which may have a particle size of 0.5 to 150 µm. For example, a sufficient gas flow is applied to help ensure a velocity of the powder in the resulting gas/powder mixture of 300 to 2,000 m/s, preferably 300 to 1,200 m/s. The mixture is directed on to the surface of an object. On the surface of the object, the impinging metal powder particles form a layer, the particles becoming severely deformed, but preferably are not melted. The powder particles are advantageously present in the jet in an amount which ensures a flow rate density of the particles of from 0.01 to 200 g/s cm$^2$, preferably 0.01 to 100 g/s cm$^2$, very preferably 0.01 g/s cm$^2$ to 20 g/s cm$^2$, or most preferred from 0.05 g/s cm$^2$ to 17 g/s cm$^2$.

After any surface preparation (e.g., surface roughening, cleaning such as by a step of detergent cleaning, or both), at least one surface of a first block is contacted, in the absence of any intermediate loose powder, with at least one surface of a second block to form a contacted joint structure. The contacting may be direct, such as by contacting opposing cold-sprayed surfaces of a plurality of blocks. The contacting may be indirect, such as via an interface preform as described herein (e.g., a tile having a side surface that has generally the same dimensions as the block surface to which it will be contacting, and having a thickness of at least about 2 mm, 4 mm or even 6 mm). The thickness may be about 20 mm or less, or even about 10 mm or less. The preform itself may include a cold sprayed side surface for contacting.

When a cold sprayed powder layer is deposited onto a surface of a block, an interface preform (e.g., a tile), or both, the average thickness of the layer may be greater than about 1, 2, 5, 10, 50, 100 µm or larger; the cold sprayed powder layer may be deposited to have an average thickness of the layer of less than about 1 cm, 1 mm, 500 µm, or 200 µm.

The interface preform (e.g., tile) may be made by a process capable of achieving a density of the preform of at least about 60% theoretical, 70% theoretical or even 80% theoretical. By way of example, conditions may be such (e.g., sufficient pressure may be applied to the powder during compaction) to define the interface preform as a tile having a density of about 65% to about 85% of theoretical density throughout the tile, and more specifically about 75% to about 85% of theoretical density. The interface preform (e.g., tile) may have a thickness of about 2 to about 10 mm (e.g., about 3 to about 7 mm, or more specifically about 4 to about 5 mm). Larger or smaller thicknesses are also contemplated Though cold isostatic pressing is one possibility, surprisingly, die-compacting a powder mixture is believed to yield excellent results as well it is also possible that a powder mixture can be cold-sprayed into a cavity of a die or other suitable tool to define a preform having the general complementary shape of the tool cavity. As to the latter it is possible that prior to deposition, the tool is contacted with a suitable low friction coating to aid in removal of the preform in later steps. The interface preform may be configured with one or more projections or other structural feature to allow gripping for removal. The tool may be configured with one or more devices for ejecting the part from the cavity.

One approach is to make an interface preform such as a tile by die compacting a mixture of two or more high purity (e.g., at least 99.5% pure, in relation to metallic impurities) metal powders. A suitable pressure is applied (e.g., at about room temperature, and optionally at an elevated temperature), for a suitable time to achieve a near net shape green compact that has a density of at least about 60, 70 or 80% of theoretical density (e.g., to about 60% to about 85% of theoretical density). By way of example, a pressure of at least about 60 ksi, 70 ksi or 60 ksi (e.g., on the order of about 1250 tons over about 30 square inches) may be employed. A pressure of less than about 200 ksi, 150 ksi or 100 ksi may be employed. The pressure may be applied for a time of at least 10 seconds, 15 seconds, 20 seconds or 30 seconds. The pressure may be employed for a time of less than 5 minutes, less than 3 minutes or even less than one minute.

Another possible approach to making an interface preform may employ steps that result in a loosely sintered preform, such as a tile. That is, sintering may be employed at a temperature and time sufficient for a mass of metal powder to densify sufficiently so that a cohesive and self-supporting mass is formed that can be readily handled and is free of loose powder. The preform may be made by mixing a mass of metal powder (which may include powders of one, two or more metals). A binder may be included within the resulting mixture. The mass of powder with the binder may be spread to a generally uniform thickness and sintered. The selection of the binder and the temperatures and times of sintering may be such that, during sintering, the binder is consumed and results in a certain amount of porosity. For example, a polymeric binder may be employed. Sintering may be employed at a temperature and time sufficient for the mass of metal powder to realize at least about 50%, 60%, 70%, or even 80% of theoretical density. Sintering may be employed at a temperature and time sufficient for the mass of metal powder to density to less than about 95%, 90% or even 85% theoretical density. The sintering may be performed under evacuated conditions. The sintering may be performed under an inert atmosphere or under a reducing atmosphere. The sintering atmosphere may be free of hydrogen.

Another approach is to make an interface preform such as a tile by cold spraying a powder mixture onto both sides of a thin sheet that includes molybdenum and at least one other element (e.g., Ti). The cold sprayed powder layer may be deposited to have an average thickness of the layer of less than about 1 cm, 1 mm, 500 µm, or 200 µm.

It is also possible to cold spray a powder mixture onto a sacrificial or disposable substrate (e.g., brass sheet zinc sheet, or galvanized steel sheet) to make an interface preform such as a tile. Instead of preparing the substrate as is typically done using such methods as a grit blasting step, it is also possible to prepare the substrate with a detergent cleaning step to avoid embedding ceramic grit particles in the substrate surface. Detergents based on dipropylene glycol methyl ether may be employed to clean the substrate, followed by a water rinse with distilled deionized water until the surface passes the "Standard Test Method for Hydrophobic Surface Films by the Water-Break Test," per ASTM F22-02(2007). Following the detergent cleaning step, the substrate can be cold sprayed in successive layers, preferably of greater than about 50 μm and less than about 250 μm per pass, to build a cold spray deposit with a preferable total thickness of greater than about 1.5 mm and less than about 2 mm. Each pass may be performed under the same or varied conditions. Preferably, the first pass may be performed at high density conditions to achieve greater adhesion (e.g., increased gas velocity and increased pressure from the nozzle through which the metal powder mixture is emitted). To achieve less than full density on successive passes, the gas velocity can be reduced. Following the cold spray application, a relatively smooth surface of the deposit is desired; however, some porosity is also desirable throughout the body of the cold spray deposit to allow for creep or movement during the hot isostatic pressing process. Porosity may be achieved by varying the velocity of the stream of the metal powder mixture through the nozzle during the cold spray process by controlling the temperature and gas pressure. The cold spray deposit surface may have a certain amount of porosity, which may be generally uniform throughout. For example, the porosity may range from about 5 to about 25% by volume (e.g., about 15%) as measured by ASTM B962-08. The resulting exposed cold spray deposit surface may also have a surface topography that includes a generally uniform distribution of peaks and valleys, such as a topography by which there is between about 25 μm and 50 μm from peak to valley.

Processing to form the interface preform (e.g., tile) may be under suitable conditions for avoiding shrinkage of the preform during subsequent steps. That is, for instance, the continuous solid interface portion thus may be the result of employing a cohesive mass that is formed in situ with metal powder blocks (e.g., by a cold spraying operation) or is formed as a perform (e.g., a tile that is compacted, sintered, and/or cold sprayed). Though the cohesive mass is contemplated to have some porosity, desirably the average size of any pores is sufficiently small and the pores are substantially uniformly distributed so that voids would not result in irregular shrinkage in a consolidated joint following a final consolidating step to make a large area target.

The blocks may be contacted along their respective side edges (e.g., at least partially along a length or a width of each block). It also may be possible to stack two or more blocks. The contacted blocks are encapsulated in a pressing vessel, such as a suitable hot isostatic pressing container (e.g., a mild steel can that is hermetically sealed for pressing). They are then hot isostatically pressed to a desired shape at a temperature that is less than about 1100 or 1000° C. (e.g., for molybdenum-containing materials and others) and at a pressure and for a time sufficient to realize a consolidated joint between the first and second blocks. A preferred approach may include a step of hot isostatically pressing a powder mass at a pressure of at least about 75 MPa, or even at least about 100 MPa. A preferred approach may include a step of hot isostatically pressing a powder mass at a pressure of less than about 300 MPa, less than about 250 MPa, or even less than about 175 MPa. The HIP process desirably may be performed and at a temperature below about 1080° C. (e.g., about 1050° C.), below about 1000° C.; below about 950° C. or even below about 900° C. (e.g., at about 890° C.). As such, the HIP process may be free of a step of heating the powder, the can, or both to a temperature of about 1000° C. or higher. The HIP process may range in duration from about 1 to about 16 hours, and more preferably about 3 to about 8 hours (e.g., about 4 hours). After the pressing is completed, the can may be removed. Following the hot isostatic pressing process, irregularities within the surface of any cold spray deposits are smoothed out, and there are no detectable pores. Other details about pressing operations can be gleaned from U.S. Pat. No. 7,837,929 ((Gaydos et al) incorporated by reference) (see e.g., the Examples).

In yet another aspect of the teachings herein, it is contemplated that sputtering is performed using a sputtering target in accordance with the present teachings. It also is contemplated that thin films result that are used in any of a number of electronic devices (e.g., as a barrier layer, and electrode layer or both), such as one or more of television, a video display, a smartphone, a tablet computer, a personal digital assistant, a navigation device, a sensor, a photovoltaic device, or a portable entertainment device (e.g., video players, music players, etc.).

The thin films may have a reduced amount of structural artifacts attributable to particles as compared with sputtering using targets with powder joints, and are substantially uniform in structure (e.g., greater than about 98%). The thin films may have a thickness of less than about 350 nm, less than about 225 nm, or even less than about 100 nm. The thin films may have a thickness of greater than about 5 nm, or even greater than about 10 nm. For example, the films may nave a thickness of about 15 to about 25 nm. The thin film may exhibit a resistivity value of about 70 to about 90, or even about 75 to about 85 μΩ·cm (using a four point probe). The thin film may exhibit a 5B adhesion rating for adhesion to a substrate may of either Corning 1737 glass or amorphous silicon (e.g., amorphous silicon coated glass per ASTM D:3359-02). The thin film preferably exhibits good interfacing capability with copper conductors, such as copper conductive layers in display devices.

The targets herein may be made in a process that is free of any hot working step, any forging step, or both. Though the temperatures for hot isostatic pressing preferably are below 1100° C., they may be about 1100° C. or higher, or even 1200° C. or higher.

The teachings herein contemplate that resulting target body materials include at least one pure metallic elemental phase, such as pure Mo (and more preferably at least two pure metallic elemental phases, such as pure Mo and pure Ti), along with at least one alloy phase (e.g., β(Ti, Mo) phase). However, it is possible that the resulting target body will have substantially no alloy phase, such as a β(Ti, Mo) phase (i.e., about 15% (by volume) or less).

The microstructure of resulting target bodies preferably is substantially uniform throughout the body. In a typical target body that includes molybdenum and at least one other element (e.g., Ti), the microstructure preferably exhibits a matrix of pure molybdenum, with regions of the other element distributed substantially uniformly throughout the matrix. Regions of the other element phase (e.g., pure titanium phase) are generally equiaxed. Regions of the other element phase (e.g., pure titanium phase) may vary in size substantially uniformly throughout the body. For example, such regions may achieve a largest region diameter on the order of about 200 μm. Regions of the pure element phase (e.g., pure titanium phase) may have an average region diameter of about 50 to about 100 μm.

Bonding of adjoining blocks may take place along a side edge of a block, across a face of a block, or both.

With reference to the drawings, FIG. 1 illustrates an example of a block 10, having an upper surface 12 (which may be a sputtering surface in a finished target) and a side wall 14. The side wall 14 is shown having a layer of cold spray deposited powder on it. The powder may be delivered, via an apparatus (not shown) having a nozzle 16 through which a stream 18 of a metal powder mixture is emitted while at a temperature (e.g., about room temperature) below the atmospheric pressure melting temperature of any of the metals of the metal powder mixture. Two or more blocks such as block 10 (each having a layer of cold sprayed powder deposited in it) may thereafter be contacted with each other, encapsulated, and hot isostatically pressed as described herein.

Figure 2:
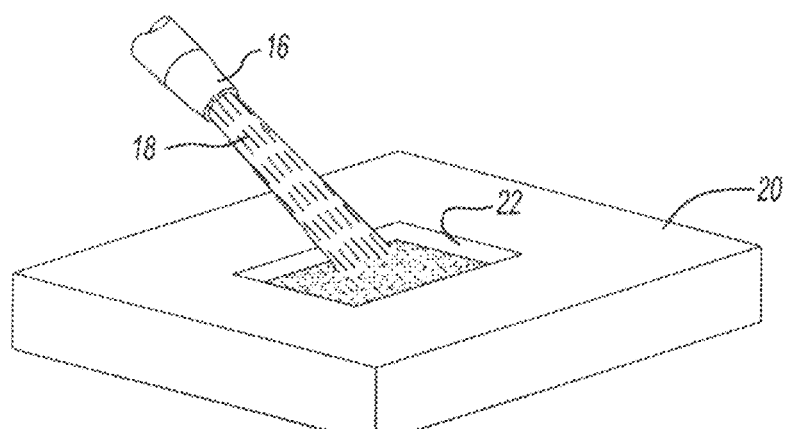
FIG. 2 is an illustration a cold spray formation of a tile.

FIG. 2 illustrates a tool 20 having a cavity 22 into which a stream 18 of cold spray powder may be introduced to define a part that is generally complementary in shape with the shape of the cavity. In this manner a preform (e.g., a tile) may be formed that will serve as a continuous solid interface portion between opposing blocks.

Figure 3:
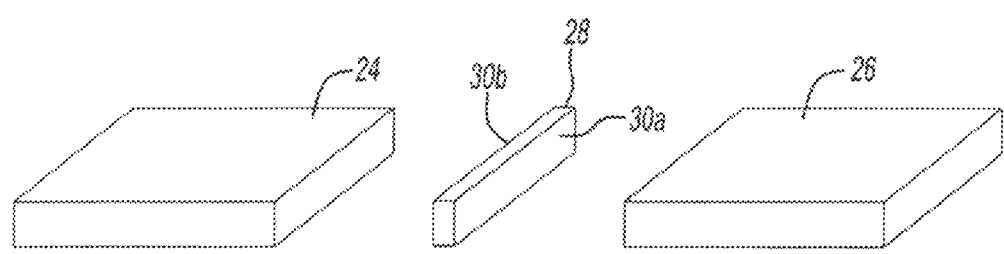
FIG. 3 is an exploded perspective view of a block-tile-block structure.

FIG. 3 illustrates an example of the relative positions of a first block 24, a second block 26 and interface preform (e.g., tile) 28 having opposing joining surfaces 30a and 30b, in an assembly made in accordance with the teachings herein. As can be appreciated in instances when one or both of the blocks have cold spray deposited surface, such as surface 14 of FIG. 1, the preform may be omitted. It is also possible that the preform may have a cold spray deposited side surface (e.g., joining surfaces 30a and/or 30b of FIG. 3 may have a cold spray deposited surface. The blocks 24 and 26 may be assembled together with the interface preform between them, encapsulated, and hot isostatically pressed as described herein.

As to all of the teachings herein, including those in the following examples, the volume percent of the respective phases are determined by a method that follows the principles from ASTM standards E562-11 and E1245-03 (2008). Following this method, an SEM backscatter detection (BSE) mode image is taken such that the phases are distinguishable by the intensity of pixels in a black-and-white image. Using BSE mode, the number of scattered electrons will be directly related to atomic number, so heavier elements will appear brighter. For example, the large difference in atomic number of Mo (42) and Ti (22) makes the identification of each element possible from a backscatter image. The alloy phase will typically appear gray, with an intensity between brightest pure elemental (e.g., Mo) regions (showing as the most white) and the darkest pure elemental (e.g., Ti) regions, as illustrated in FIGS. 4a and 4b below. By analyzing a pixel intensity histogram (8-bit image; intensities from 0-255), thresholds can be defined and the area percentage of each phase can be calculated by a pixel count of the intensity range for each phase. Since the material is believed to be substantially homogeneous with no preferred direction for any phase, the area percentage is treated as being equal to the volume percentage of each phase. For the above analysis, the person skilled in the art will recognize that it is possible that the thresholds may be defined in an objective manner by measuring the minima between peaks in a pixel intensity histogram derived from the BSE image. For example, these minima can be calculated by fitting a 2nd-order polynomial equation to the histogram data at the regions between peaks.

Figure 4:
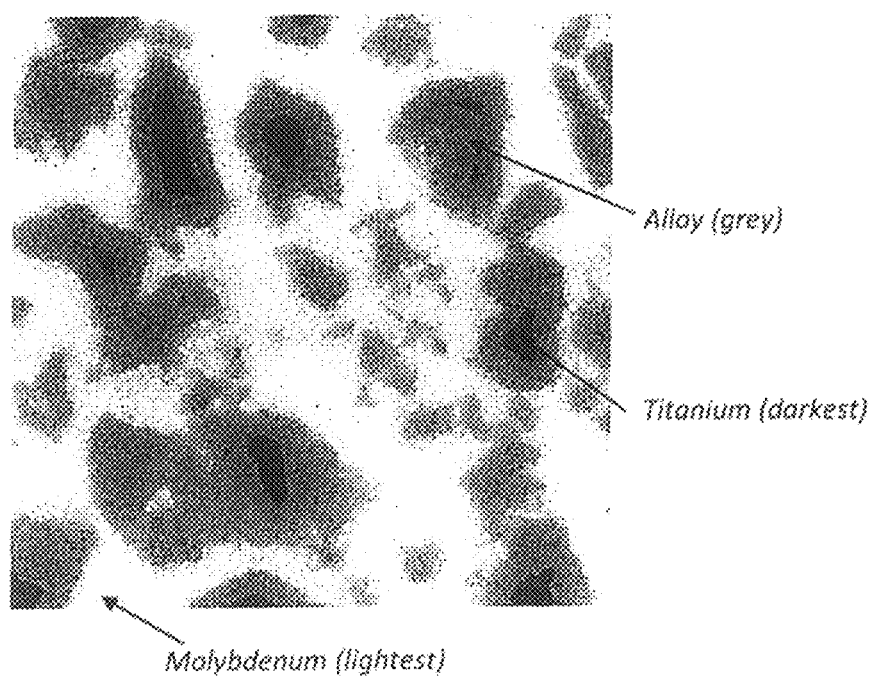
FIG. 4 is an illustrative scanning electron microscope backscatter photomicrograph at 500× for illustrating phase amounts that may be expected in a hot isostatically pressed target made from a mixture of 50 at % molybdenum and 50 at % titanium powders.

By way of illustration, with reference to FIG. 4, there is shown generally an illustrative microstructure that may be expected for a Mo—Ti target body prepared by hot isostatic pressing of a metal powder mixture having about 50 at % Mo and 50 at % Ti. In these scanning electron microscope images (in backscatter electron detection mode), the pure titanium phase is the darkest phase. The medium shaded phase essentially surrounding the titanium is a titanium/molybdenum alloy phase (e.g., believed to be a β-phase, but which has varying concentrations of titanium and molybdenum throughout), and the lightest phase is molybdenum. For the embodiment of FIG. 4, there is seen to be a volume percentage of β-phase of about 55.7 vol %, about 39.6 vol % Mo and about 4.7 vol % Ti.

As seen from the above, an approach to the formation of large area sputtering targets is provided. The approach is predicated generally upon the avoidance of joining consolidated blocks using (as the primary or main joinder mechanism) diffusion bonding via hot isostatic pressing of a loose powder between the blocks. The present teachings envision employing a continuous solid interface portion as an intermediate layer between the blocks. The continuous solid interface portion may be made by (a) cold spraying at least one metal powder onto at least one of the blocks for forming the at least one continuous solid interface portion; (b) compacting a body of a metal powder mixture to form the at least one continuous solid interface portion; (c) sintering a body of a metal powder mixture to form the at least one continuous solid interface portion; (d) cold spraying at least one metal powder into a die for forming the at least one at least one continuous solid interface portion; (e) cold spraying a metal powder onto a substrate to form the at least one continuous solid interface portion that may optionally include, but preferably omits, the substrate; or (f) any combination of (a) through (e). It should be appreciated that reference to "continuous solid interface portion" does not require that such portion be free of any porosity. As the teachings indicate, some porosity is to be expected (e.g., prior to a final hot isostatic pressing operation, the density of any of the described continuous solid interface portions may be at least about 60%, 70%, 80% or higher). Desirably, during any steps of making the continuous solid interface portion starting powders of two or more, though mixed together, remain unalloyed, and may not become alloyed until a subsequent hot isostatic pressing operation.

The present teachings are illustrated by reference to sputtering targets that include molybdenum with one or more other elements. The teachings may also be applicable to other materials as well, and are not necessarily limited to molybdenum-containing systems. For example, other refractory metals (e.g., tungsten, niobium, tantalum or any combination thereof) may be employed in a major amount (at %, vol % or wt %) of the target. The present teachings may be employed as an alternative for bonding adjoining blocks that include two discontinuous phases and/or that heretofore require explosive bonding techniques. By way of example, without limitation, Ta/Ta-2.5 W clad plates may be joined using the techniques herein. Further, though the teachings herein are particularly applicable to join consolidated powder metallurgy derived target blocks, they can also be employed to join cast or ingot-derived blocks (e.g., electron beam melted and thermomechanically processed blocks).

One benefit of the teachings herein is believed due to the avoidance of potential issues with segregation, low density, and/or shrinkage, which are often associated with hot isostatic pressing diffusion bonding with the use of a powder for defining an interlayer. Without intending to be bound by theory, the conditions taught herein are selected to that there is an enhanced driving force for atomic transport from the solid interface portion during a final consolidation step due to the reduction in surface energy (and perhaps strain energy) to the interface, which in turn helps to enhance bonding. These mechanisms are not believed to exist using other techniques in the published literature, and are believed to result in a consolidated interface portion that is chemically, metallurgically, and visually substantially indistinguishable from the bulk material in the blocks.

As to all of the foregoing general teachings, as used herein, unless otherwise stated, the teachings envision that any member of a genus (list) may be excluded from the genus; and/or any member of a Markush grouping may be excluded from the grouping. Percentages of the sputtering target expressed herein refer to the material of the sputtering. Percentages of the sputtering target expressed herein refer to the material of the sputtering target available for sputter deposition, and do not include other sputter target components, such as backing plates.

Unless otherwise stated, any numerical values recited herein include all values from the lower value to the upper value in increments of one unit provided that there is a separation of at least 2 units between any lower value and any higher value. As an example, if it is stated that the amount of a component, a property, or a value of a process variable such as, for example, temperature, pressure, time and the like is, for example, from 1 to 90, preferably from 20 to 80, more preferably from 30 to 70, it is intended that intermediate range values such as (for example, 15 to 85, 22 to 68, 43 to 51, 30 to 32 etc.) are within the teachings of this specification. Likewise, individual intermediate values are also within the present teachings. For values which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner. As can be seen, the teaching of amounts expressed as "parts by weight" herein also contemplates the same ranges expressed in terms of percent by weight. Thus, an expression in the Detailed Description of a range in terms of at "'x' parts by weight of the resulting polymeric blend composition" also contemplates a teaching of ranges of the same recited amount of "x" in percent by weight of the resulting composition.

Unless otherwise stated, all ranges include both endpoints and all numbers between the endpoints. The use of "about" or "approximately" in connection with a range applies to both ends of the range. Thus, "about 20 to 30" is intended to cover "about 20 to about 30", inclusive of at least the specified endpoints. Concentrations of ingredients identified in Tables herein may vary ±10%, or even 20% or more and remain within the teachings.

The disclosures of all articles and references, including patent applications and publications, are incorporated by reference for all purposes. The term "consisting essentially of" to describe a combination shall include the elements, ingredients, components or steps identified, and such other elements ingredients, components or steps that do not materially affect the basic and novel characteristics of the combination. The use of the terms "comprising" or "including" to describe combinations of elements, ingredients, components or steps herein also contemplates embodiments that consist essentially of, or even consist of the elements, ingredients, components or steps. Plural elements, ingredients, components or steps can be provided by a single integrated element, ingredient, component or step. Alternatively, a single integrated element, ingredient, component or step might be divided into separate plural elements, ingredients, components or steps. The disclosure of "a" or "one" to describe an element, ingredient, component or step is not intended to foreclose additional elements, ingredients, components or steps. All references herein to elements or metals belonging to a certain Group refer to the Periodic Table of the Elements published and copyrighted by CRC Press, Inc., 1989. Any reference to the Group or Groups shall be to the Group or Groups as reflected in this Periodic Table of the Elements using the IUPAC system for numbering groups. It is understood that the above description is intended to be illustrative and not restrictive. Many embodiments as well as many applications besides the examples provided will be apparent to those of skill in the art upon reading the above description. The scope of the invention should, therefore, be determined not with reference to the above description, but should instead be determined with reference to the appended claims, along with the full scope of equivalents to which such claims are entitled. The disclosures of all articles and references, including patent applications and publications, are incorporated by reference for all purposes. The omission in the following claims of any aspect of subject matter that is disclosed herein is not a disclaimer of such subject matter, nor should it be regarded that the inventors did not consider such subject matter to be part of the disclosed inventive subject matter.

What is claimed is:

1. A sputtering target, comprising:
   a. at least two consolidated blocks, each block including an alloy including molybdenum in an amount greater than about 30 percent by weight and at least one additional alloying element;
   b. at least one continuous solid interface portion derived from a cold spray deposition, a sintered preform body, a compacted powder body or any combination thereof; and
   c. a joint between the at least two consolidated blocks, which joins the blocks together to define a target body, the joint including the at least one continuous solid interface portion, wherein the sputtering target along the joint exhibits a transverse rupture strength per ASTM B528-10, of at least about 400 MPa,
   wherein:
      each block has a microstructure that is characterized as including a substantially pure molybdenum phase, a substantially pure phase of the at least one additional alloying element, and a third phase that includes an alloy of molybdenum and the at least one additional alloying element,
      the third phase is present in an amount greater than 30 volume percent,
      the substantially pure molybdenum phase is at least 99.5% pure, and
      the substantially pure phase of the least one additional alloying element is at least 99.5% pure.

2. The sputtering target of claim 1, wherein throughout the target body there is a substantially continuous and uniform distribution of the three phases.

3. The sputtering target of claim 1, wherein the at least one additional alloying element includes titanium.

4. The sputtering target of claim 3, wherein the amount of the substantially pure molybdenum phase is about 30 to about 60 vol % of the sputtering target body.

5. The sputtering target of claim 4, wherein the amount of the substantially pure molybdenum phase is less than about 48 vol % of the sputtering target body.

6. The sputtering target of claim 5, wherein the amount of the substantially pure phase of the at least one additional alloying element is about 5 to about 25 vol %.

7. The sputtering target of claim 6, wherein the substantially pure phase of the at least one additional alloying element is titanium and is present in an amount less than about 10 vol %.

8. The sputtering target of claim 6, wherein the amount of the alloy of molybdenum and the at least one additional alloying element is about 40 to about 65 vol %.

9. The sputtering target of claim 6, wherein the alloy of molybdenum and the at least one additional alloying element includes a β-phase of molybdenum and titanium, in an amount greater than about 40 vol % of the alloy, of the target, or both.

10. The sputtering target of claim 1, wherein the continuous solid interface portion includes a cold spray deposition onto an edge surface of at least one of the consolidated blocks.

11. The sputtering target of claim 10, wherein the continuous solid interface portion is a cold spray deposition onto a first edge surface of one of the consolidated blocks and a cold spray deposition onto a second edge surface of a different consolidated block, wherein the first edge surface and the second edge surface are contacted and joined surfaces.

12. The sputtering target of claim 11, wherein the continuous solid interface portion is interposed between the two consolidated blocks.

13. The sputtering target of claim 12, wherein the two or more consolidated blocks have the same composition, and wherein the sputtering target includes the molybdenum and at least one alloying element selected from titanium, chromium, niobium, tantalum, tungsten, zirconium, or any combination thereof.

14. The sputtering target of claim 13, wherein the at least one alloying element is niobium.

15. The sputtering target of claim 13, wherein the at least one alloying element is tantalum.

16. The sputtering target of claim 12, the consolidated joint of the sputtering target has a transverse rupture strength per ASTM B528-10, of at least about 620 MPa.

17. The sputtering target of claim 12, wherein the continuous solid interface portion is derived from a cold spray deposition having a porosity of 5 to 25% by volume as measured by ASTM B962-08.

18. The sputtering target of claim 1, wherein the continuous solid interface portion is derived from a tile having a density of 60% to 85% of theoretical density.

19. The sputtering target of claim 1, wherein the substantially pure molybdenum phase is present in an amount greater than 30 volume percent.

20. The sputtering target of claim 1, wherein the substantially pure molybdenum phase is present in an amount greater than 40 volume percent.

21. The sputtering target of claim 1, wherein the substantially pure phase of the at least one additional alloying element is present in an amount greater than 1 volume percent.

* * * * *